United States Patent [19]

Person et al.

[11] Patent Number: 5,453,716

[45] Date of Patent: Sep. 26, 1995

[54] ADJUSTABLE CLIP DETECTION SYSTEM

[75] Inventors: Andrew P. Person; James P. Muccioli, both of Farmington Hills, Mich.

[73] Assignee: Chrysler Corporation, Highland Park, Mich.

[21] Appl. No.: 156,112

[22] Filed: Nov. 22, 1993

[51] Int. Cl.⁶ ........................................... H03G 3/20
[52] U.S. Cl. .................................. 330/2; 381/107
[58] Field of Search ........................... 330/2, 149, 279, 330/129; 381/104, 107, 108

[56] References Cited

U.S. PATENT DOCUMENTS

| | | | |
|---|---|---|---|
| 4,318,053 | 3/1982 | Sondermeyer | 330/2 X |
| 4,463,341 | 7/1984 | Iwasaki | 340/825.76 X |
| 4,815,141 | 3/1989 | Carver et al. | 381/94 |
| 5,126,687 | 6/1992 | Onoda et al. | 330/149 |

Primary Examiner—Steven Mottola
Attorney, Agent, or Firm—Christopher A. Taravella

[57] ABSTRACT

In an adjustable clip detection system, an audio output signal is sent from a volume control integrated circuit to an amplifier. The output of the amplifier is received by a clip detection circuit. The clip detection circuit monitors the audio output from the amplifier for clipping distortion. If clipping is detected, the clip detection circuit sends a signal to a microprocessor. The microprocessor then sends a signal to a volume control integrated circuit to decrease the voltage level of the audio output until clipping is no longer detected. The amount of attenuation that the microprocessor instructs the volume control integrated circuit to perform is determined by a predetermined programmed parameter. The amount of attenuation to be performed by the volume control integrated circuit can be adjusted by sending the microprocessor a formatted message, through a multiplex bus, corresponding to the predetermined program parameter located in a look-up table.

7 Claims, 3 Drawing Sheets

ATTENUATION CHART

| A/D | V-A | CLIP MODE M1 | CLIP MODE M2 | CLIP MODE M3 | CLIP MODE M4 | CLIP MODE M5 |
|---|---|---|---|---|---|---|
|  | VDC | (dB) | (dB) | (dB) | (dB) | (dB) |
| 256-232 | 5.00-4.53 | REF | REF | REF | REF | REF |
| 256-224 | 5.00-4.37 | REF | - 2 | REF | REF | REF |
| 223-208 | 4.35-4.06 | - 2 | - 4 | REF | - 2 | - 2 |
| 207-192 | 4.04-3.75 | - 4 | - 6 | - 2 | - 2 | - 4 |
| 191-176 | 3.73-3.43 | - 6 | - 8 | - 4 | - 4 | - 6 |
| 175-160 | 3.42-3.12 | - 8 | - 10 | - 6 | - 6 | - 8 |
| 159-144 | 3.10-2.81 | - 10 | - 12 | - 8 |  | - 10 |
| 143-128 | 2.79-2.5 | - 12 | - 14 | - 10 |  | - 12 |
| 127-112 | 2.48-2.18 | - 14 | - 16 | - 12 |  | - 14 |
| 111-96 | 2.17-1.87 | - 16 | - 18 | - 14 |  | - 16 |
| 95-80 | 1.86-1.56 | - 18 | - 20 | - 16 |  |  |
| 79-64 | 1.54-1.25 | - 20 | - 22 | - 18 |  |  |
| 63-48 | 1.23-0.94 | - 22 | - 24 | - 20 |  |  |
| 47-32 | 0.92-0.62 | - 24 | - 26 | - 22 |  |  |
| 31-00 | 0.61-00 | - 26 | - 28 | - 24 |  |  |

FIG.4

CLIP CONTROL MESSAGE

ADR CLIP CONTROL MESSAGE
   22   MESSAGE Id
   01   MESSAGE Id MODIFIER
   XX   DATA BYTE 1
       BIT
       2-0   CLIP DETECTION MODE
            210
            000 - NO CLIP DETECTION
            001 - MODE 1  10% THD KEEP
            010 - MODE 2  5% THD KEEP
            011 - MODE 3  15% THD KEEP
            100 - MODE 4  MAX 6dB ATTEN. (3 STEPS)
            101 - MODE 5  MAX 16dB ATTEN. (8 STEPS)
            110 - MODE 6  RESERVED
            111 - MODE 7  RESERVED 7-3   RESERVED

FIG.5

ADJUSTABLE CLIP DETECTION SYSTEM

FIELD OF THE INVENTION

The present invention relates to automatic distortion-compensating systems for the radios of vehicles and, more particularly, to a clip detection system whereby audio output is monitored and automatically reduced to prevent distorted sound. Still more particularly, the present invention relates to a clip detection system that may be turned off and on and adjusted to the preference of the primary

BACKGROUND OF THE INVENTION

Circuits for automatically compensating for distortions generated in output signals from a power amplifier are well known. Such circuit configuration are known to include distortion detection circuits. An example of such circuits is shown in the prior art drawings of U.S. Pat. No. 5,126,687, issued to Onada et al. Conventional circuits known prior to the invention of an "Amplifier System for Automatically Minimizing Distortion" by Onada et al. required a sharp cut-off characteristic in a band-elimination filter and unnecessarily optimize operation of control circuits even when the main input signal is small.

Onada et al. disclosed an automatic distortion compensating amplifier system without the problematic requirements just discussed. In the Onada et al. invention, the distortion detection signal attains a difference of a main input signal having no distortion and a reference (no distortion) signal representing the main output signal, while the main input signal and the reference signal are kept in phase and equal in level. A control circuit sends a predetermined output signal to a power amplifier in order to eliminate distortion. This clipping detection feature automatically turns on when the output signal of the amplifier exceeds a predetermined distortion reference signal.

The Onada et al. system nevertheless has some drawbacks. One disadvantage is that the Onada et al. clipping detection once installed cannot be defeated for a primary listener who desires loud and distorted sounds, for example, a loud rock and/or "rap" afficionado. A like disadvantage is the subjective preference of primary listeners that may not find the predetermined reference signal desirable.

SUMMARY OF THE INVENTION

An object of the present invention is to provide a clipping detection system that can be defeated for a primary listener who desires loud and distorted sounds.

Another object of the present invention is to provide a clipping detection system that can be adjusted for the subjective preference of a primary listener.

A related object of the present invention is to provide a clipping detection system that can be conveniently installed at the option of the purchaser of a vehicle having a radio in accordance with the present invention.

In order to achieve the above object, there is provided a multiplex bus that is connected to a radio. The multiplex bus, which reduces wiring interconnects and improves reliability in a diagnostic system, couples communicating microprocessors in modules, including a body computer, an engine controller, a transmission controller, and other functional components of an automobile.

The radio includes a microprocessor connected to the bus with other components for an adjustable clipping detection system. The system includes a volume control integrated circuit coupled to an amplifier. The amplifier is coupled to a clip detection circuit. The clip detection circuit is connected to a microprocessor. The microprocessor is, in turn, connected to a volume control integrated circuit.

The audio output signal is sent from the volume control integrated circuit to the amplifier. The output of the amplifier is received by the clip detection circuit. The clip detection circuit monitors the audio output from the amplifier for clipping distortion. If clipping is detected, the clip detection circuit sends a signal to the microprocessor. The microprocessor then sends a signal to the volume control integrated circuit to decrease the voltage level of the audio output until clipping is no longer detected. Once the clip detection circuit informs the microprocessor that clipping no longer occurs, the microprocessor sends a message to the volume control integrated circuit to return the output signal to its original level.

The amount of attenuation that the microprocessor instructs the volume control integrated circuit to perform is determined by a predetermined programmed parameter. The amount of attenuation to be performed by the volume control integrated circuit can be adjusted by sending the microprocessor a formatted message, through the bus, corresponding to the predetermined program parameter located in a look-up table. This programming can be carried out through a diagnostic tool, for example a stand-alone computer, in a vehicle service center. The adjustment may be made to take in account the characteristics of the particular vehicle in which the radio is installed or the particular preferences of the primary listener, for example, the owner-driver of the vehicle.

BRIEF DESCRIPTION OF THE DRAWINGS

Other objects, features, and advantages of the present invention will become more fully apparent with the following detailed description of the preferred embodiment, the appended claims, and the accompanying drawings in which:

FIG. 4 is a table illustrating the amount of attenuation required for various possible clip detection modes.

FIG. 5 is a table illustrating formatted control messages of the present invention.

DETAILED DESCRIPTION OF THE PREFERRED EMBODIMENTS

Figure 1:
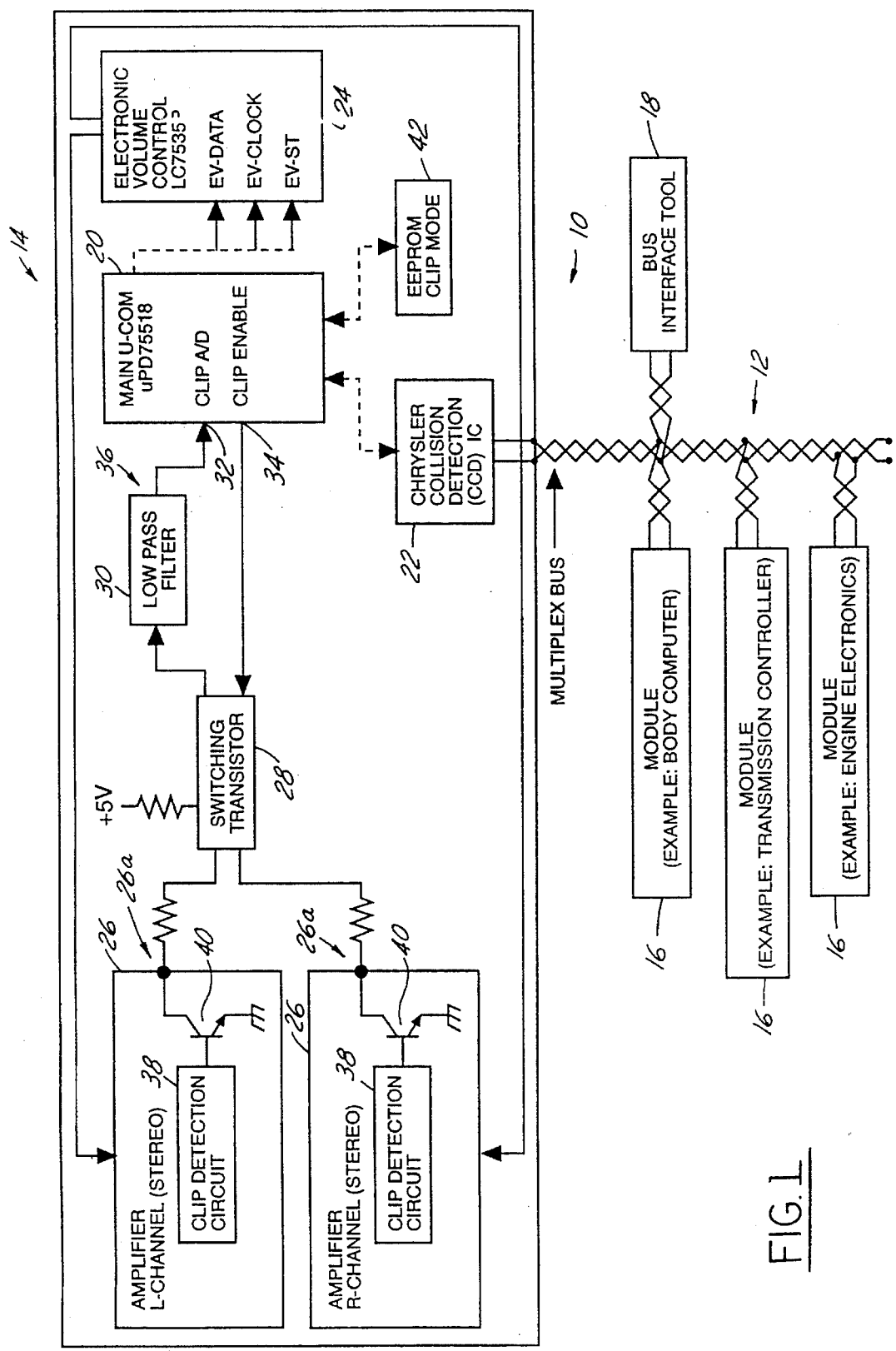
FIG. 1 is a block diagram of a adjustable clip detection system in a radio connected to a multiplex bus in accordance with the teachings of the preferred embodiment of this invention.

Referring now to the drawings, wherein like reference numerals are used to identify identical components in various views, FIG. 1 is a block diagram depicting an electronic network employing the adjustable clip detection system 10 of the present invention. The network is contained within a vehicle (not shown). Extending throughout the vehicle is a multiplex bus 12 which functions to control and monitor functional components of the automobile for purposes other than to accomplish the objects of the present invention, but which may be utilized for such purposes.

The adjustable clip detection system 10 for purposes of the present invention includes the multiplex bus 12. As a part of the adjustable clip detection system 10, the bus 12 is coupled to an audio unit, such as a radio 14. The radio 14 may have such standard features as AM and FM bands and tape and CD players.

Via the bus 12, the radio 14 is coupled to various automotive modules 16 including a body computer and other units that control and/or monitor various utilities of a vehicle, such as the engine and transmission.

The multiplex bus 12 preferably uses differential two wire twisted pairs of a style known to those of ordinary skill in the automotive electrical arts so that standard automotive connectors and automotive modules may be used and standard automotive assembly plant procedures may be maintained.

The multiplex bus 12 allows data to be efficiently transferred between modules 16 and the radio 14 via a communication protocol having a predetermined message format. A bus interface tool 18 allows a user to access the multiplex bus 12 so that an appropriate formatted bus message can be sent to and received by the radio 14 and/or the modules 16, for diagnostic purposes, as is known in the art. This feature, as will be explained, also may be used by the present invention to control clipping detection according to the particular preferences of a primary listener.

The modules 16 may be used to talk to each other for purposes of diagnosing faults. The module 16 that is the body computer monitors various predetermined parameters of the other modules 16, such as vehicle speed, rpm, transmission gear, and acceleration. Each of the modules 16 can be added and deleted with little or no impact on the bus 12 without affecting the other modules 16 connected to the bus 12, other than to affect the other modules 16 due to added message volume or protocol. Information from one module 16 may be used by other modules 16 to eliminate the need for sensors and associated wiring circuits. For example, information from the engine control unit 16a when it is in wide open throttle communicates that the vehicle is attempting maximum acceleration. Such information may be used by a module (not shown) measuring fluid levels or by modules (not shown) trying to level the vehicle or by a transmission control module 16b selecting gears in anticipating the engine's needs. The common bus 12 used throughout the vehicle is used by assembly plants and service centers of dealers to communicate with a common piece of test equipment via the bus interface tool 18. Hardware and software included in each module 16 provides for pre-defined bus diagnostic messages that are different for each specific module 16.

Still with reference to FIG. 1, the radio 14 has a main microprocessor 20 of the radio 14 so that bus messages can be transmitted and received using a predetermined format. A clip detection bus interface integrated circuit 22 provides access to the main microprocessor 20. The main microprocessor 20 is connected to an electronic volume control integrated circuit 24 which is connected in parallel to a pair of amplifiers 26. The amplifiers 26 are connected through a switching (NPN) transistor 28 through a low pass filter 30 to the clip A/D port 32 of the main microprocessor 20. For reasons as will be explained, a clipping detection pin 34 is connected to the switching transistor 28, to complete a switching transistor circuit 36.

As can also be seen with reference to FIG. 1, the amplifiers 26 include clip detection circuits 38. The output clip detection terminal 26a of each amplifier 26 has an open collector structure, as diagrammatically represented. The terminal connects to the clip detection circuit 38 through an NPN transistor 40.

An Electrically Erasable Programmable Read-Only Memory (EEPROM) integrated circuit 42 is also coupled to the microprocessor 20 for storing the ON/OFF mode of the adjustable clip detection system 10.

Figure 2:
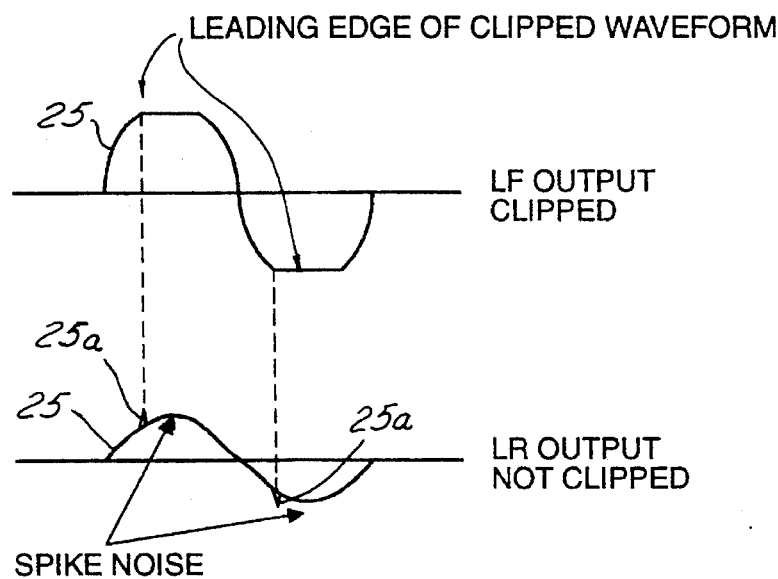
FIG. 2 is a block diagram of a waveform to which the present invention is directed.
Figure 3:
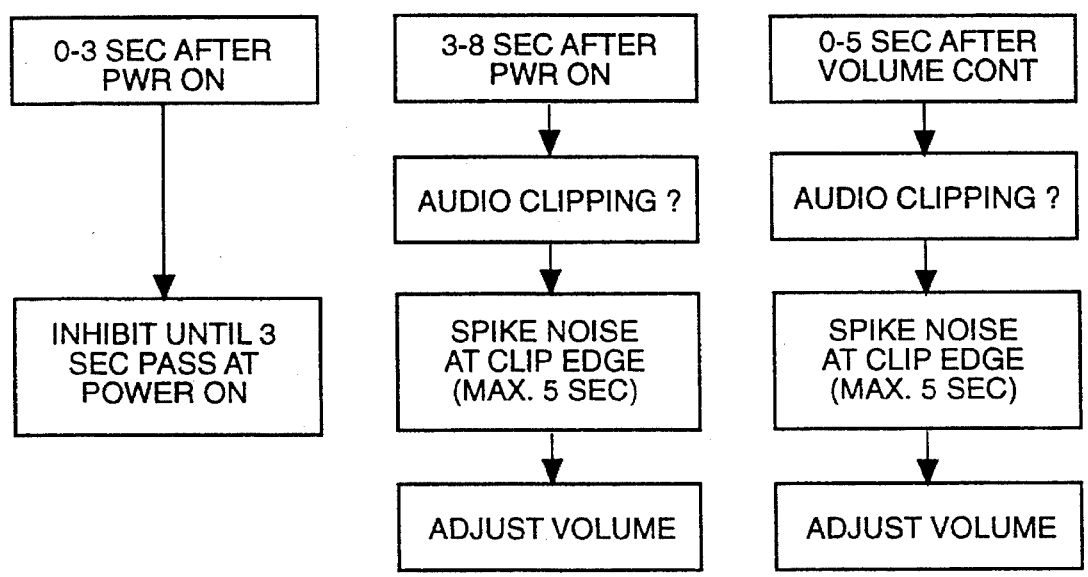
FIG. 3 is a flow chart illustrating the general sequence of steps associated with the operation of the system found in FIG. 1.

Referring to FIG. 2 along with FIG. 1, when an amplified audio signal output waveform 25 is clipping, the clip detection circuit 38 of each amplifier operates and the NPN transistor 40 is turned ON. Spike noise 25a is generated during audio clipping at the pulse edge of the waveform 25 when the clipping detection circuit 38 is operated and the NPN transistor 40 is turned ON. It is for this reason for the switching circuit 36 to enable or disable the audio amplifier clipping detector pin 34. When this pin 34 is disabled, there is no switching noise. The clipping detection is enabled for a short time when the clip detection circuit 38 is powered ON, about 1.5 seconds, and for 5 seconds every time the radio volume control knob position is changed as shown in the flow chart of FIG. 3.

If the switching transistor circuit 34 is enabled when an amplified audio signal output waveform 25 is clipping, then a clipping detection signal is filtered by the low pass filter 30 and sent to the A/D port 32 of the main microprocessor 20. The microprocessor 20 then sends a signal to the electronic volume control integrated circuit 20 to decrease the input level of each audio amplifier 26 by a predetermined volume control step profile, for example, a 2 dB step, 1 step per 100 msec or a 28 dB maximum attenuation. This process of reducing the amplifier input level continues until the clipping input voltage level reaches a corresponding predetermined fixed level of distortion, for example, 10% total harmonic distortion (thd) or 5% thd or 15% thd, until the maximum amount of volume control attenuation has been applied.

The amount of volume control attenuation that the microprocessor 20 instructs the electronic volume control integrated circuit 24 to perform, while the microprocessor 20 is receiving a clipping input signal, is determined by a predetermined programmed parameter as shown in the attenuation table of FIG. 4. The amount of clipping distortion, and corresponding volume attenuation, can be adjusted by sending the main microprocessor 20 a formatted bus message as shown in FIG. 5. For example, if clip detection mode M1 is desired in which attenuation is controlled to maintain 10% total harmonic distortion, a message data byte formatted as "xxxx x001" is sent to the microprocessor 20.

The main microprocessor 20 of adjustable clip detection system 10 is programable via the bus 12. During a regular visit to an automobile service center for diagnostic testing of the automobile's electronic parts, programming may be accomplished via the bus interface tool 18 used for the diagnostic testing. The tool 20 allows a user access to the multiplex bus 12 so that the appropriate formatted bus message that turns the adjustable clip detection system 10 ON or OFF can be sent to and received by the bus interface integrated circuit 30. Moreover, the main microprocessor 20 or the body computer module 16 may be programmed with instructions in accordance with the primary listener's preferences. Thus, the attenuation level may be adjusted by adjusting the number of steps in the attenuation chart of FIG. 5, according to the characteristics of the vehicle or the preference of the primary listener.

A method of adjusting the clipping detection system of a vehicle having an audio unit coupled to a detection circuit, an electronic volume control circuit, and a microprocessor, said clip detection circuit, electronic volume control circuit, and microprocessor coupled to a multiplex bus, the method comprising the step of using the electronic diagnostic tool to program said microprocessor with instructions to decrease the volume of the audio unit in predetermined steps in accordance with distorted signals received by said microprocessor, said predetermined steps being programmed according to the level of distortion preferred by a primary listener.

We claim:

1. An adjustable clip detection system for a vehicle, the system comprising:

an amplifier for outputting a main output signal including a distortion;

clip detection means electronically coupled to said amplifier, for generating a clipping detection signal;

microprocessor means electronically connected to said clip detection circuit, said microprocessor means programmed to send a predetermined signal in response to said clipping detection signal when in a selected one of plurality of clip modes;

volume control means electronically connected to said microprocessor means and said amplifier for decreasing the input level of said amplifier in response to said predetermined signal from said microprocessor means, said predetermined signal corresponding to one of a plurality of predetermined programmed parameters indicative of an attenuation amount of the input level of said amplifier, said amount being based upon said selected clip mode, whereby when said amplifier outputs said signal including a distortion, said clip detection generates a clipping detection signal, said microprocessor means sends said predetermined signal and said volume control means decreases the input level of said amplifier until a determinate parameter is reached.

2. The adjustable clip detection system of claim 1, wherein said determinate parameter is a predetermined fixed level of distortion.

3. The adjustable clip detection system of claim 1, wherein volume control means applies volume control attenuation in response to said predetermined signal from said microprocessor means and said determinate parameter is a maximum amount of volume control attenuation.

4. The adjustable clip detection system of claim 1, wherein the volume control means is an integrated circuit.

5. An adjustable clip detection system for a vehicle, the system comprising:

an amplifier for outputting a main output signal including a distortion;

clip detection means electronically coupled to said amplifier; for generating a clipping detection signal:

microprocessor means electronically connected to said clip detection circuit, said microprocessor means programmed to send a predetermined signal in response to said clipping detection signal;

volume control means electronically connected to said microprocessor means and said amplifier for decreasing the input level of said amplifier in response to said predetermined signal from said microprocessor means, whereby when said amplifier outputs said signal including a distortion, said clip detection generates a clipping detection signal, said microprocessor means sends said predetermined signal and said volume control means decreases the input level of said amplifier until a determinate parameter is reached, and wherein a switching circuit is coupled to said clip detection means and said microprocessor means to eliminate spike noise during audio clipping.

6. An adjustable clip detection system for a vehicle, the system comprising:

an amplifier for outputting a main output signal including a distortion;

clip detection means electronically coupled to said amplifier, for generating a clipping detection signal:

microprocessor means electronically connected to said clip detection circuit, said microprocessor means programmed to send a predetermined signal in response to said clipping detection signal;

volume control means electronically connected to said microprocessor means and said amplifier for decreasing the input level of said amplifier in response to said predetermined signal from said microprocessor means, whereby when said amplifier outputs said signal including a distortion, said clip detection generates a clipping detection signal, said microprocessor means sends said predetermined signal and said volume control means decreases the input level of said amplifier until a determinate parameter is reached, said system further comprising an EEPROM integrated circuit for storing an ON/OFF status of said adjustable clip detection system.

7. The system of claim 1 further comprising:

means coupled to said microprocessor means for accessing a multiplex bus.

* * * * *